US006735733B2

(12) United States Patent
La Rosa

(10) Patent No.: US 6,735,733 B2
(45) Date of Patent: May 11, 2004

(54) METHOD FOR THE CORRECTION OF A BIT IN A STRING OF BITS

(75) Inventor: Francesco La Rosa, Rousset (FR)

(73) Assignee: STMicroelectronics SA, Montrouge (FR)

(*) Notice: Subject to any disclaimer, the term of this patent is extended or adjusted under 35 U.S.C. 154(b) by 399 days.

(21) Appl. No.: 09/737,827

(22) Filed: Dec. 15, 2000

(65) Prior Publication Data

US 2001/0044922 A1 Nov. 22, 2001

(30) Foreign Application Priority Data

Dec. 15, 1999 (FR) ............................................ 99 15816

(51) Int. Cl.[7] ................................................ G11C 29/00

(52) U.S. Cl. ........................ 714/765; 714/773; 714/805

(58) Field of Search ................................ 714/773, 805, 714/765

(56) References Cited

U.S. PATENT DOCUMENTS

| | | | | |
|---|---|---|---|---|
| 3,794,819 A | * | 2/1974 | Berding | 714/805 |
| 4,967,415 A | * | 10/1990 | Tanagawa | 714/805 |
| 5,130,992 A | * | 7/1992 | Frey et al. | 714/766 |
| 5,140,597 A | * | 8/1992 | Araki | 714/805 |
| 5,218,691 A | * | 6/1993 | Tuma et al. | 703/24 |
| 5,671,239 A | | 9/1997 | Higashitani et al. | 371/51.1 |
| 5,680,579 A | * | 10/1997 | Young et al. | 711/157 |
| 5,909,449 A | * | 6/1999 | So et al. | 714/721 |
| 6,222,762 B1 | * | 4/2001 | Guterman et al. | 365/185.03 |

FOREIGN PATENT DOCUMENTS

| | | | |
|---|---|---|---|
| EP | 0305987 | 3/1989 | G06F/11/10 |
| EP | 0307958 | 3/1989 | G11C/29/00 |
| EP | 0399258 | 11/1990 | G06F/11/10 |

OTHER PUBLICATIONS

Haifley, "Endurance of Eeproms with On–Chip Error Correction" IEEE Transactions on Reliability US, IEEE Inc. New York, vol. 36, No. 2 (Jun. 1, 1987), pp. 222–223, XP000008989.

* cited by examiner

*Primary Examiner*—Stephen M. Baker
(74) *Attorney, Agent, or Firm*—Lisa K. Jorgenson; Allen, Dyer, Doppelt, Milbrath & Gilchrist, P.A.

(57) ABSTRACT

A method for the correction of an erroneous bit in a string of bits includes providing, in the string of bits, for a first parity bit computed from the other bits of the string of bits at a point in time when the erroneous bit was valid. The correct value of the erroneous bit is computed by using the other bits of the string of bits comprising the parity bit. The erroneous bit is then replaced by its correct value. The method is applicable to error correction circuits in EEPROM memories.

24 Claims, 6 Drawing Sheets

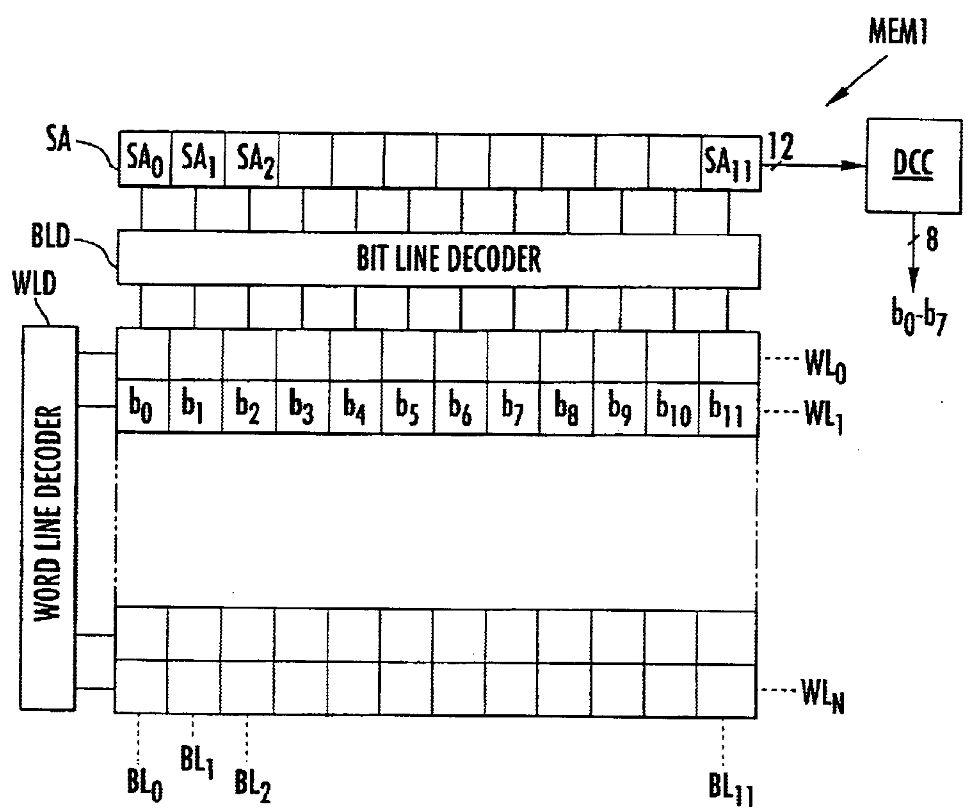
FIG. 1. (PRIOR ART)
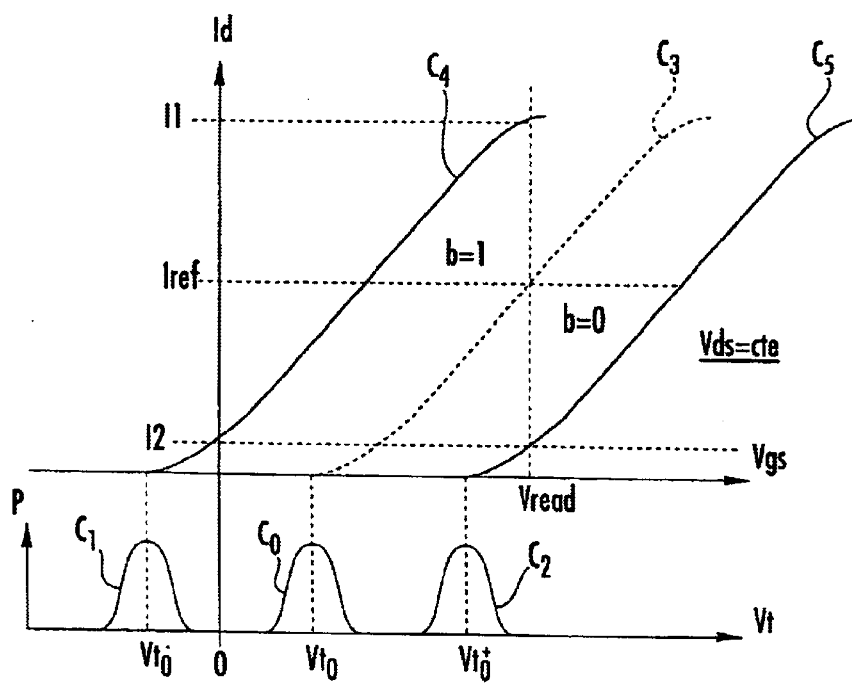
FIG. 2B. (PRIOR ART)
FIG. 2A. (PRIOR ART)

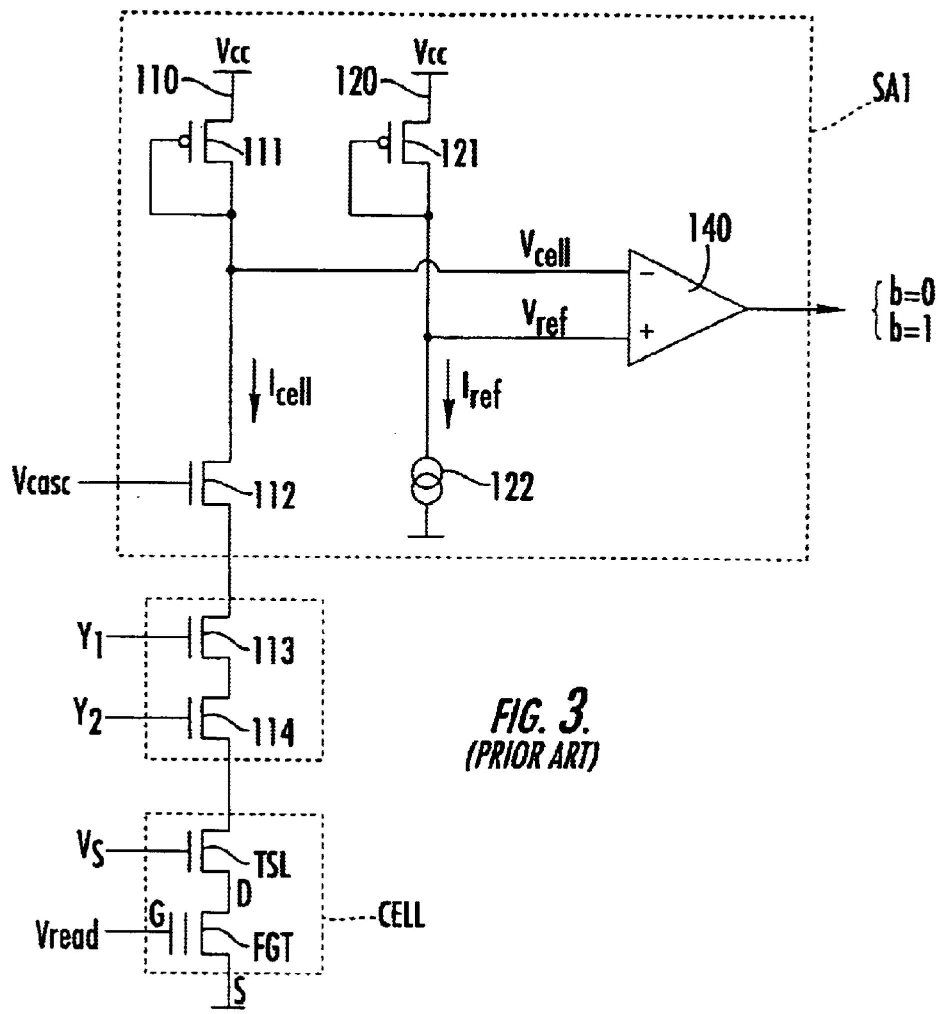
FIG. 3.
(PRIOR ART)
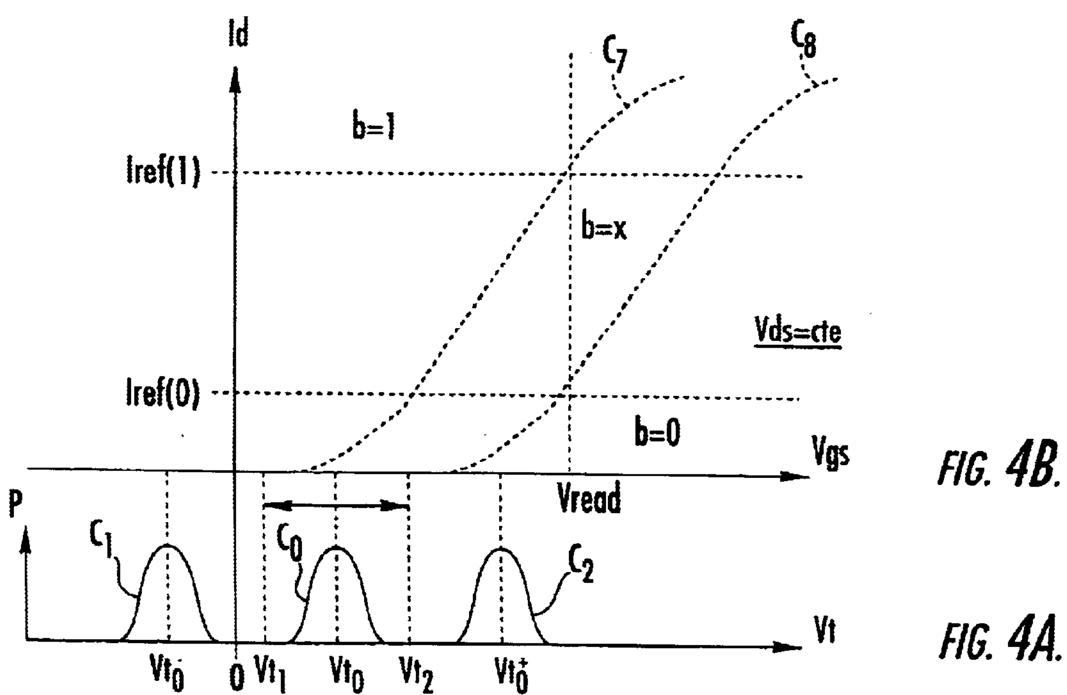
FIG. 4B.
FIG. 4A.

METHOD FOR THE CORRECTION OF A BIT IN A STRING OF BITS

FIELD OF THE INVENTION

The present invention relates to non-volatile memory cells and, more particularly, to electrically erasable and programmable memories of the EEPROM or FLASH EEPROM type comprising memory cells with floating-gate transistors.

BACKGROUND OF THE INVENTION

In electrically erasable and programmable memories, the value of a bit stored in a memory cell is represented by a remanent electrical characteristic of the cell which may be modified by cell-erasing or cell-programming operations to record a logic 1 or a logic 0.

More particularly, the programming or erasure of a memory cell comprising a floating-gate transistor includes the injection or extraction of electrical charges in the gate of the transistor by a tunnel effect (Fowler-Nordheim) or by hot electron injection using a high programming or erasure voltage $V_{PP}$ in the range of 10 to 20 V. The electrical charges injected or extracted from the floating gate determine the threshold voltage Vt of the transistor which thus forms the remanent electrical characteristic representing the bit stored in the memory cell.

The reading of a memory cell comprising a floating-gate transistor thus includes comparing the threshold voltage Vt of the transistor with a reference voltage $Vt_0$. Which is substantially midway between the negative threshold voltage of a programmed transistor and the positive threshold voltage of an erased transistor. It is assumed that the threshold voltage Vt of the transistor will remain stable in time, which is normally for several years under specified conditions of temperature and use. In other words, the electrical charges injected into the gate of the transistor remain indefinitely trapped therein so long as a reverse erasure operation is not performed, and the extracted electrical charges do not return into the erased gate so long as a reverse programming operation is not performed.

However, it may happen that manufacturing defects affect the stability of certain cells, occasionally leading to an error in the reading of a bit. For example, the negative threshold voltage of a programmed transistor, which conventionally represents a bit at a logic 1, may develop slowly towards a positive value. So long as the threshold voltage remains below the reference voltage $Vt_0$, the transistor is considered to be programmed. However, the threshold voltage can also develop substantially beyond the reference voltage $Vt_0$. There is then a data corruption so that a logic 0 is read in the memory instead of the initially recorded logic 1, or vice versa.

For this reason, a non-volatile memory is generally provided with an error correction circuit to detect and correct an erroneous bit in a string of bits using an error correction code (ECC). The error correction code is inserted into the string of bits when it is being recorded in the memory, and is computed by a specific algorithm, such as the Hamming algorithm, for example, which is well known to those skilled in the art.

The drawback of the Hamming algorithm and, more generally, of any prior art error correction algorithm is that it generates codes of a length that are not negligible with respect to the number of bits to be secured. Planning for a correction mode of this kind complicates the architecture of the memory because of the number of additional memory cells that have to be planned for its recording. Furthermore, the longer the correction code, the more complex is the error correction circuit.

FIG. 1 provides a schematic view of the architecture of a memory MEM1 comprising word lines $WL_0$ to $WL_N$ and bit lines $BL_0$ to $BL_{11}$. The memory MEM1 is provided with a word line decoder WLD, a bit line decoder BLD and a read circuit SA with twelve elementary circuits $SA_0$ to $SA_{11}$, which are known as sense amplifiers. Each word line $WL_I$ has eight data bits $b_0$ to $b_7$ and four check bits $b_8$ to $b_{11}$ forming, for example, a Hamming code used to detect and correct an erroneous bit among the twelve bits $b_0$ to $b_{11}$.

When a word line is selected by the decoder WLD and the corresponding cells are activated in a read mode by the decoder BLD, the read circuit SA delivers the twelve bits $b_0$ to $b_{11}$ of the selected word line. The bits $b_0$ to $b_{11}$ are sent to a correction circuit DCC which delivers the eight data bits $b_0$ to $b_7$ at an output after having detected and corrected an erroneous bit as the case may be.

The drawback of a memory of this kind is that it comprises 33% of cells reserved for the detection and correction of the possible malfunctioning in the other memory cells.

One approach to reduce the size of the error correction codes in non-volatile memories is disclosed in European patent application EP 307,958, which discloses an EEPROM memory comprising sense amplifiers delivering data bits, and error signals when the threshold voltage of a memory cell is in a forbidden region. As shown in FIG. 9 of this referenced application, the memory comprises an error correction circuit arranged to correct an erroneous bit by inverting the value of the erroneous bit when the corresponding error signal indicates a reading error.

The inversion of the value of the erroneous bit is done by an XOR gate which receives the erroneous bit on its first input and the output of an AND gate on its second input. The AND gate receives on its inputs the signal error and a parity bit computed by a circuit from a string of bits comprising the erroneous bit and a parity bit recorded in the memory. When the parity bit computed by the circuit is at a logic 1, this means that there is an error since the parity bit of a string of bits comprising a parity bit is always at a logic 0.

The XOR gate thus functions as an inverting gate with respect to the erroneous bit received on its other input, and delivers a logic 0 if the erroneous bit is at a logic 1 and a logic 1 if the erroneous bit is at a logic 0. However, this correction method is complex to implement since the implementation of all the XOR gates requires the use of numerous elementary logic gates.

SUMMARY OF THE INVENTION

In view of the foregoing background, an object of the present invention is to reduce the size of the error correction codes in non-volatile memories, and simplify the architecture of the memories and the structure of the error correction circuits.

Another object of the present invention is to provide a method of error correction which is relatively straightforward to implement, and which can be implemented using switching circuits, such as multiplexers, with a reduced number of logic gates.

These and other objects, advantages and features are provided by a method for the correction of an erroneous bit in a string of bits, with the method comprising a step of providing, in the string of bits, for a first parity bit computed from the other bits of the string of bits at a point in time when the erroneous bit was valid. The method further comprises a step of computing a second parity bit as a function of all the bits of the string of bits other than the erroneous bit, and a step of replacing the erroneous bit by the second parity bit.

According to one embodiment of the present invention, the erroneous bit receives, by convention, a logic value that has no effect on the parity computation, and the second parity bit is computed from all the bits of the string of bits, including the erroneous bit. The erroneous bit is preferably replaced by the second parity bit using a multiplexer circuit.

According to one embodiment, the string of bits is read in a non-volatile memory.

According to yet another embodiment, to correct more than one bit in a binary word, the string of bits is split up into at least two strings of bits, each comprising a parity bit.

The present invention also relates to a non-volatile memory comprising remanent memory cells, means for reading a string of bits in the memory, and means for the correction of an erroneous bit present in a string of bits read in the memory. The correction means computes a parity bit from the bits of the string of bits and replaces an erroneous bit by the computed parity bit.

According to one embodiment, the reading means are arranged to assign a logic value to an erroneous bit without affecting a parity computation, and the means to compute a parity bit are arranged to receive, at an input, all the bits of the string of bits, including an erroneous bit. The means to replace an erroneous bit by the computed parity bit preferably comprises a multiplexer circuit.

According to one embodiment, the reading means are arranged to deliver a bit having a first logic value when the remanent characteristic of a memory cell is above a first threshold, deliver a bit having a second logic value when the remanent characteristic of a memory cell is below a second threshold lower than the first threshold, and deliver an erroneous bit signal when the remanent characteristic of a memory cell is between the first and second thresholds. The first and second thresholds define a region comprising the domain of the virgin cells or included in the domain of the virgin cells so that the erroneous state of a bit remains stable in time.

The reading means are preferably arranged to deliver a bit having the second logic value when the remanent characteristic of a memory cell is below the first threshold. According to another embodiment, the memory comprises means to compare the current flowing through a cell with two reference currents, and sends the erroneous bit signal when the current flowing through the floating-gate transistor is between the two reference currents.

According to one embodiment, the reading means comprises a first comparator to compare the current flowing through a cell with a first reference current delivering a first bit used as a data bit read in the cell, a second comparator to compare the current flowing through a cell with a second reference current delivering a second bit, and an XOR function to combine the first bit and the second bit and deliver an erroneous bit signal.

BRIEF DESCRIPTION OF THE DRAWINGS

These objects and characteristics of the present invention as well as others shall be explained in greater detail in the following description of a method of reading a memory cell incorporating an error detection function and an error correction method, with reference to the appended figures, of which:

FIG. 1 is a schematic view of the architecture of a non-volatile memory according to the prior art;

FIGS. 2A and 2B illustrate a method for reading a memory cell comprising a floating-gate transistor according to the prior art;

FIG. 3 is an electrical diagram of a circuit for reading a memory cell according to the prior art;

FIGS. 4A and 4B illustrate a method for reading a memory cell and detecting an erroneous bit according to the present invention;

DETAILED DESCRIPTION OF THE PREFERRED EMBODIMENTS

Figure 5:
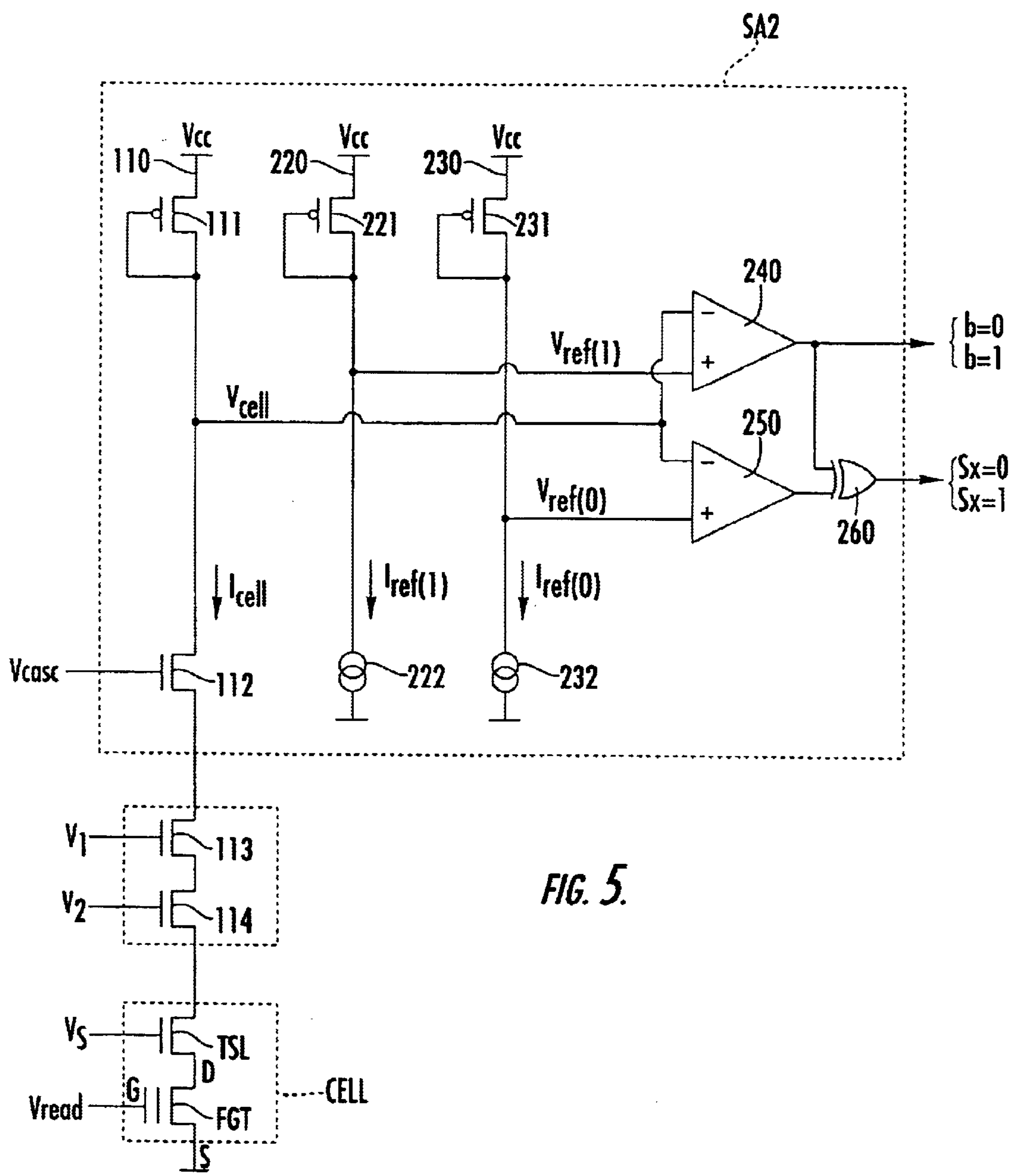
FIG. 5 is an electrical diagram of a read circuit implementing the method according to the present invention.

FIG. 2A shows three curves $C_0$, $C_1$, $C_2$ illustrating the statistical distribution of a threshold voltage Vt of a floating-gate transistor depending on the state of the transistor. The Y axis represents a probability P. The curve $C_0$, centered on a positive value $Vt_0$, shows the distribution of the threshold voltage Vt of a virgin transistor that has never been programmed or erased, or has been erased by ultraviolet light.

The curve $C_1$, centered on a negative value $Vt_0-$, represents the distribution of the negative threshold voltage Vt− of a programmed transistor and corresponds by convention to a bit equal to a logic 1. The curve $C_2$ centered on a positive value $Vt_0+$ greater than Vt+ represents the distribution of the positive threshold voltage Vt+ of an erased transistor and corresponds by convention to a bit equal to a logic 0.

FIG. 2B shows, with reference to FIG. 2A, three curves $C_3$, $C_4$, $C_5$ illustrating the current Id flowing through a floating-gate transistor as a function of the gate-source voltage Vgs that is applied to it for a constant drain-source voltage Vds. The curve $C_3$ is the current/voltage curve of a virgin transistor with a threshold voltage $Vt_0$. The curve $C_4$ is the current/voltage curve of a programmed transistor having a threshold voltage $Vt_0-$, and the curve $C_5$ is the current/voltage curve of an erased transistor having a threshold voltage $Vt_0+$.

In practice, the detection of the threshold voltage Vt of a transistor for reading a bit is done by measuring the current Id flowing through the transistor by applying a predetermined read voltage $Vgs=V_{read}$ to its gate. The operating point corresponding on the curve $C_3$ (virgin cell) gives a current $I_{ref}$. Thus, any transistor in the programmed state having a threshold voltage Vt included in the curve $C_1$ of FIG. 2A has a current Id greater than $I_{ref}$, and any transistor in the erased state having a threshold voltage Vt included in the curve $C_2$ has a current Id below $I_{ref}$. For example, transistors respectively having threshold voltages equal to the voltages $Vt_0-$ and $Vt_0+$ (curves $C_4$ and $C_5$) are crossed by currents I1 and I2 shown in FIG. 2B when the voltage $V_{read}$ is applied to them.

FIG. 3 shows a prior art read circuit SA1, which is generally called a sense amplifier, for reading a memory cell (CELL). The memory cell is arranged in a bit line 110 powered by a voltage Vcc. The bit line 110 comprises the following in series: a transistor-diode 111, a cascode transistor 112, two bit line selection transistors 113, 114 and the memory cell. The memory cell comprises the following in series: a cell selection transistor TSL and a floating-gate transistor FGT. The read circuit SA1 comprises the transistor-diode 111 and the cascode transistor 112 mentioned above, an arm 120 and a comparator 140. The arm 120 comprises the following in series: a transistor-diode 121 and a current generator 122 delivering the reference current $I_{ref}$ described above. The cathode of the transistor-diode 111 is connected to the negative input of the comparator 140, and the cathode of the transistor-diode 121 is connected to the positive input of the comparator 140.

To select the bit line and read the cell CELL, two signals Y1 and Y2 delivered by a bit line decoder are applied to the gates of the transistors 113 and 114, a voltage Vcasc is applied to the transistor 112, a voltage Vs is applied to the gate of the selection transistor TSL and the read voltage $V_{read}$ is applied to the gate of the transistor FGT. The drain-source current $I_{cell}$ going through the transistor FGT causes the appearance of a voltage $V_{cell}$ at the cathode of the transistor-diode 111. The comparator 140 thus receives, at its negative input, the voltage $V_{cell}$ and, at its positive input, a voltage $V_{ref}$ delivered by the arm 120. Its output delivers the bit "b" recorded in the cell. The bit "b" is at a logic 1 if the current $I_{cell}$ is higher than $I_{ref}$ or at a logic 0 if the current $I_{cell}$ is lower than $I_{ref}$.

As explained in the background of the invention section, the existence of a manufacturing defect of the transistor FGT may have the consequence wherein the threshold voltage $Vt_0-$ of the transistor FGT in the programmed state, belonging to the curve $C_1$ (FIG. 2A), gradually develops towards positive values in a region comprising the curve $C_0$. This curve represents the domain of the virgin cells. As long as the voltage $Vt_0-$ remains below the voltage $Vt_0$, the read circuit SA1 delivers a bit at a logic 1.

However, the voltage $Vt_0-$ may also develop appreciably beyond the voltage $Vt_0$ while remaining in the domain of the virgins cells because a programmed transistor cannot become an erased transistor and vice versa. The crossing of the voltage $Vt_0$ causes a data corruption because the output of the read circuit SA1 in this case delivers a bit at a logic 0. Conversely, the threshold voltage $Vt_0+$ of the transistor FGT in the erased state, belonging to the curve $C_2$, may develop towards low values that are in the left-hand part of the domain of the virgin cell. The read circuit SA1 then delivers a bit at a logic 1 instead of a bit at a logic 0 or vice versa. A read error of this kind is detected in the prior art by an error correction code whose drawbacks have been listed above.

A description shall now be given of a method for reading a memory cell while detecting the presence of an erroneous bit. FIG. 4A is identical to FIG. 2A and defines a "forbidden" region bounded by two voltages $Vt_1$ and $Vt_2$. Voltage $Vt_2$ is higher than voltage $Vt_1$. The voltage $Vt_1$ is preferably between the curve $C_1$ and the curve $C_0$, and the voltage $Vt_2$ is between the curve $C_0$ and the curve $C_2$. In other words, the forbidden region includes the domain of the virgin cells in which the data corruption phenomena occurs.

According to the invention, it will be assumed that any memory cell having a threshold voltage Vt included in the forbidden region contains an erroneous bit. The "erroneous" state according to the invention remains stable over time because the threshold voltage of an initially programmed or erased transistor, which has developed towards the domain of the virgin cells, naturally cannot develop beyond this domain.

In FIG. 4B, which is similar to FIG. 2B, the two voltages $Vt_1$, $Vt_2$ correspond to two voltage/current curves $C_7$, $C_8$ for a drain-source bias voltage Vds that is constant and determined. By choosing a read voltage $V_{read}$ that is higher than the voltage $Vt_2$ applied to the gate of a memory cell, the corresponding points of operation on the curves $C_7$, $C_8$ define two currents $I_{ref(1)}$, $I_{ref(0)}$ that are respectively higher and lower than the reference current $I_{ref}$ used in the prior art to read a cell.

Thus, any floating-gate transistor having a drain-source current Id higher than $I_{ref(1)}$ will be considered to contain a bit at a logic 1. Any floating-gate transistor having a drain-source current Id below $I_{ref(0)}$ will be considered to contain a bit at a logic 0 and any floating-gate transistor having a working current Id ranging from $I_{ref(0)}$ to $I_{ref(1)}$ will be considered to contain an erroneous bit.

FIG. 5 shows a read circuit SA2 according to the invention connected to a memory cell CELL arranged in a bit line 110. The cell and the bit line 110 have been described above with reference to FIG. 3. The read circuit SA2 comprises the transistor-diode 111 and the cascode transistor 112 of the bit line 110, two arms 220, 230 and two comparators 240, 250. The arm 220 has a transistor-diode 221 and a current generator 222 delivers the reference current $I_{ref(1)}$ described above.

The arm 230 comprises a transistor-diode 231, and a current generator 232 delivers the reference current $I_{ref(0)}$ described above. The bit line 110 delivers a voltage $V_{cell}$ taken at the cathode of the transistor-diode 111. The arm 220 delivers a voltage $V_{ref(1)}$ taken at the cathode of the transistor-diode 221, and the arm 230 delivers a voltage $V_{ref(0)}$ taken at the cathode of the transistor-diode 231.

The voltages $V_{cell}$, $V_{ref(1)}$ are applied respectively to the negative input and positive input of the comparator 240 whose output delivers the bit "b" read in the cell. The voltages $V_{cell}$, $V_{ref(0)}$ are applied respectively to the negative input and positive input of the comparator 250 whose output is combined with the output of the comparator 240 in an XOR gate 260. The output of the gate 260 delivers an error signal Sx.

Operation of the circuit SA2 is described in the following table. By convention, if the signal Sx is equal to a logic 1 this indicates a read error.

| State of the cell | Current $I_{cell}$ | Bit "b" | Signal Sx |
|---|---|---|---|
| Programmed | $I_{cell} > I_{ref(1)}$ | b = 1 | 0 |
| Erased | $I_{cell} < I_{ref(0)}$ | b = 0 | 0 |
| Indeterminate state (virgin cell) | $I_{ref(0)} < I_{cell} < I_{ref(1)}$ | b = 0 | 1 (error) |

Thus, the circuit SA2 is used to detect a "doubtful" cell whose threshold voltage Vt has shifted from its original value to enter the forbidden region described above which includes the domain of the virgin cells. Here, an erroneous bit "b" corresponds to a logic 0 at the output of the comparator 240, but this value is not important since the signal Sx is equal to a logic 1 which indicates that the bit has to be corrected. As indicated above, an erroneous bit remains stable in time and cannot tend towards the logic values 0 or 1 because the domain of the virgin cells is stable by nature.

The read method just described is used to detect an erroneous bit. Since an erroneous bit is generally included in a string of bits, it may be corrected by any prior art algorithm, and by the insertion of a correction code in the string of bits. However, it will be recalled here that a goal of the present invention is to plan for a correction method that is simple to implement and necessitates a short-length correction code. Since the error detection is done at the stage when the bit is read, it is sufficient that the method should enable the correction of the erroneous bit, and it is not necessary that it should detect the erroneous bit.

According to the invention, the correction of an erroneous bit requires that the provision of a string of bits comprises a first parity bit recorded in the memory, and is computed when the bits in the string of bits were assumed to be valid. When the erroneous bit is detected, a second parity bit is computed from all the bits in the string of bits including the initial parity bit while excluding the erroneous bit. The second parity bit thus calculated gives the correct value of the erroneous bit. The erroneous bit is then replaced by the second parity bit. A parity bit is conventionally equal to a logic 1 when the number of bits at the logic 1 is uneven, and a logic 0 when the number of bits is even.

Figure 6A:
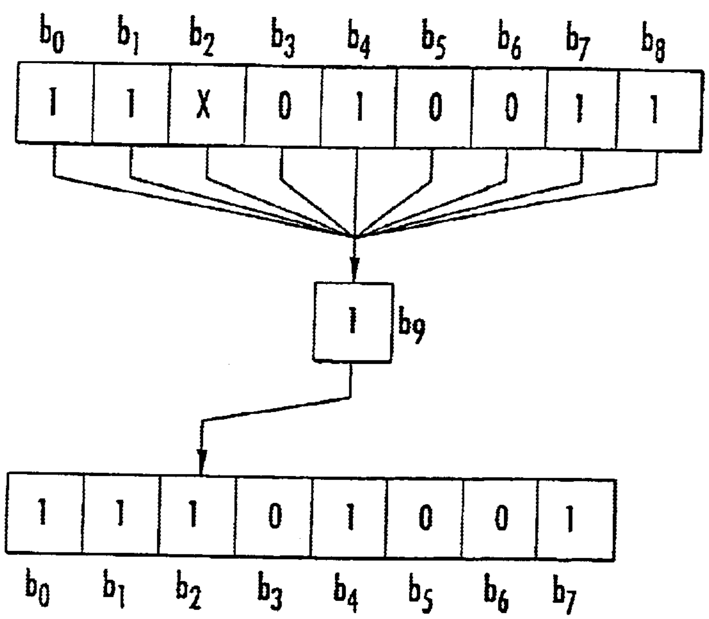
FIGS. 6A and 6B respectively illustrate a method for correcting erroneous bits according to the present invention.

The method according to the invention is illustrated by FIG. 6A which shows the string of bits $b_0$ to $b_8$ as follows:

1 1 X 0 1 0 0 1 1

The bit $b_8$ is the parity bit of the bits $b_0$ to $b_7$ computed at an instant when these bits are presumed to be valid. The bit $b_2$ is presumed to be erroneous and its value is represented by “X”. According to the invention, a new parity bit $b_9$ is computed from the bits $b_0$, $b_1$, $b_3$ to $b_8$. The new parity bit $b_9$, herein equal to a logic 1, is placed in the string of bits instead of the erroneous bit $b_2$.

Apart from its extreme simplicity, this method has the advantage of requiring only one parity bit to correct an erroneous bit, regardless of the length of the string of bits. Of course, it is possible to plan for two parity bits in a string of bits to correct two erroneous bits, three parity bits to correct three erroneous bits, etc. For example, the following string:

$b_0$ $b_1$ $b_2$ $b_3$ $b_4$ $b_5$ $b_6$ $b_7$ $b_8$ $b_9$ comprises eight data bits $b_0$ to $b_7$. The bit be is the parity bit of the bits $b_0$–$b_3$ and the bit $b_9$ is the parity bit of the bits $b_4$–$b_7$.

Naturally, the computation of parity may be done according to any other convention, such as by taking account of the odd number of bits at a logic 0 or the even number of bits at a logic 1, for example. Furthermore, the parity bit is not necessarily placed at the end of the string and may occupy a predetermined rank in a string of bits.

Figure 7:
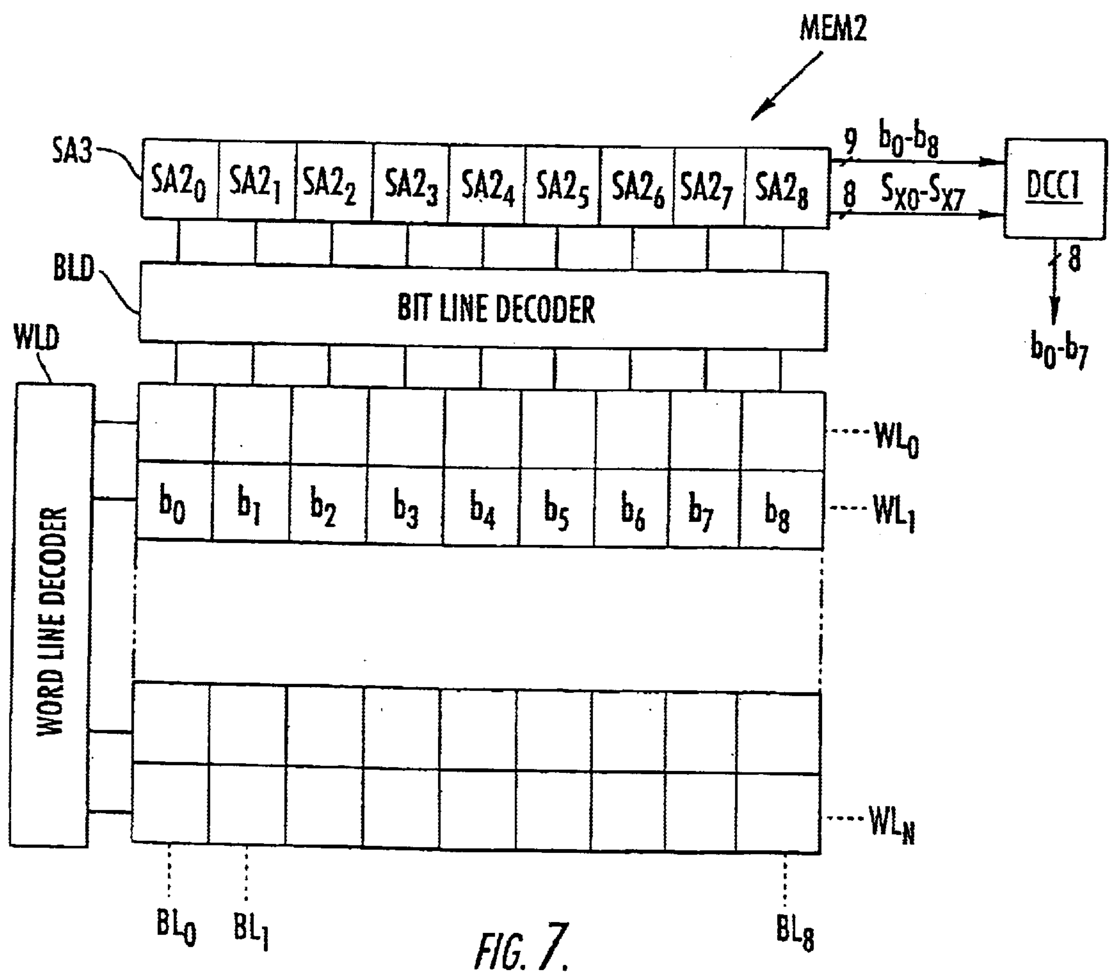
FIG. 7 is a schematic view of the architecture of a non-volatile memory according to the present invention.

A description shall now be given of an exemplary implementation, in conjunction, of the two methods according to the invention in a memory MEM2 shown schematically in FIG. 7. The memory MEM2 comprises word lines $WL_0$ to $WL_N$ and bit lines $BL_0$ to $BL_8$, each comprising eight data bits $b_0$ to $b_7$ and one parity bit $b_8$. The memory MEM2 comprises a word line decoder WLD, a bit line decoder BLD and a read circuit SA3.

The circuit SA3 comprises eight read circuits SA2$_0$ to SA2$_7$ and one read circuit SA1$_8$. The circuits SA2$_0$ to SA2$_7$ are in conformity with the circuit SA2 described above with reference to FIG. 5 and are dedicated to the reading of the data bits $b_0$–$b_7$. The circuit SA1$_8$ is in conformity with the prior art circuit SA1 described with reference to FIG. 3 and is dedicated to the reading of the parity bit $b_8$. The read circuit of the parity bit could of course be a circuit SA2 according to the invention but the detection of an error on a parity bit is not of great utility here.

Thus, at output, the circuit SA3 delivers the nine bits $b_0$–$b_8$ of a word line $WL_i$ selected by the decoder WLD and eight error signals $Sx_0$ to $Sx_7$ corresponding to the data bits $b_0$ to $b_8$. The bits $b_0$ to $b_8$ and the signals $Sx_0$ to $Sx_7$ are applied to the input of an error correction circuit DCC1 according to the invention. The circuit DCC1 delivers, at an output, the eight data bits $b_0$ to $b_7$ after having corrected, if necessary, and an error bit bi since the signal Sxi sent for this bit is equal to a logic 1.

It is clear that the memory MEM2 has a simpler structure than the memory MEM1 since only one correction bit $b_8$ is associated with each 8-bit word. Thus, the correction bits herein represent only 12.5% of the cells of the memory MEM2 as compared to 33% in the prior art. Furthermore, the correction circuit can be made in a relaticely straightforward way as shall be now described.

Figure 8:
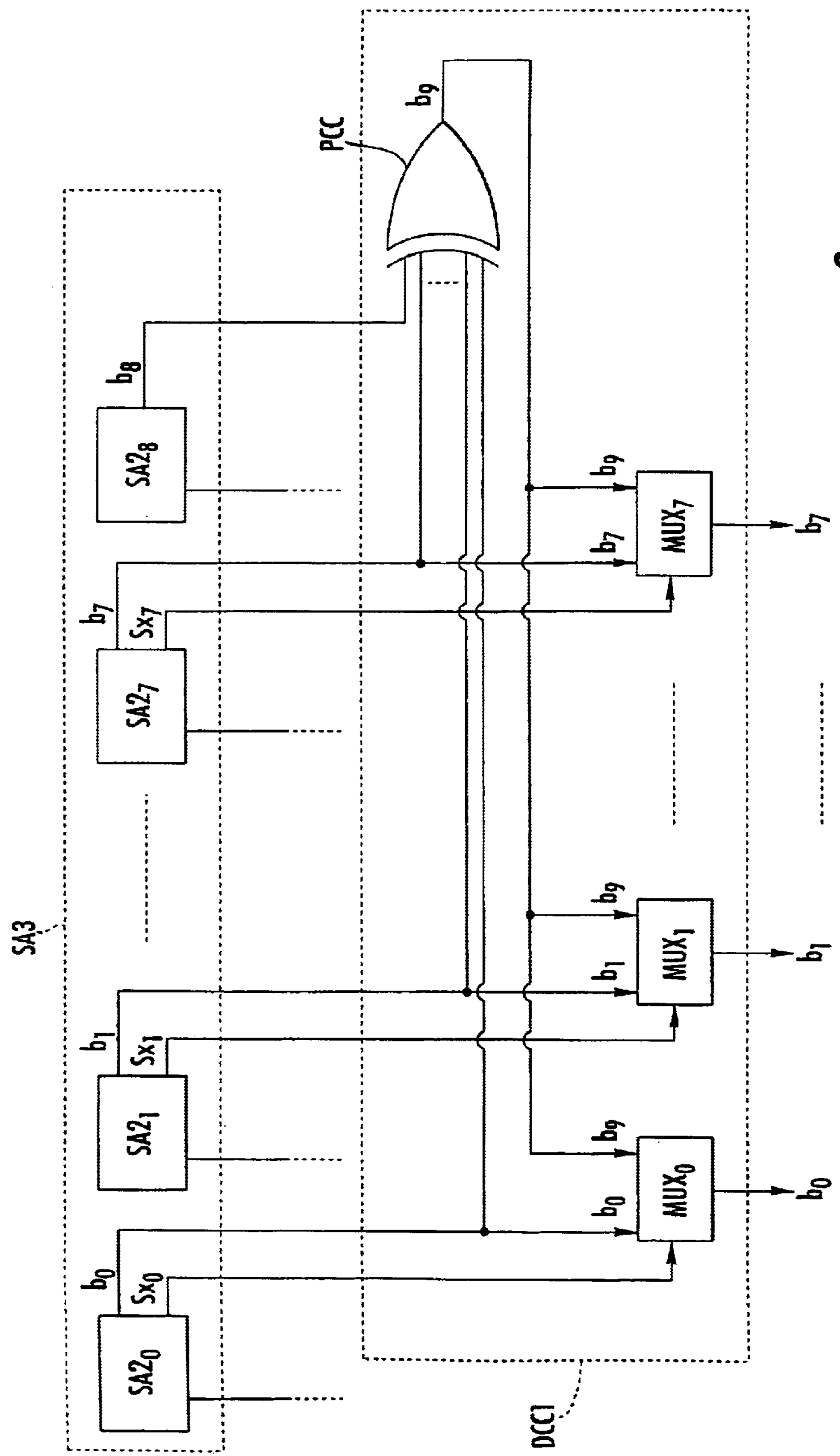
FIG. 8 is an electrical diagram of the error correction circuit illustrated in FIG. 7.

FIG. 8 shows an embodiment of the correction circuit DCC1. This circuit comprises eight multiplexers MUX0 to MUX7 and one parity computation circuit PCC which herein takes the form of an XOR gate with nine inputs. At input, the circuit PCC receives the nine bits bto $b_8$ delivered by the read circuit SA3 and delivers a parity bit $b_9$. The multiplexers MUX0 to MUX7 each comprise two data inputs and one control input. Each multiplexer MUX0 to MUX7 receives, at its first data input, one of the bits $b_0$ to $b_7$ delivered by the circuits SA2$_0$–SA2$_7$, and receives the parity bit $b_9$ at its other data input and one of the signals $Sx_0$–$Sx_7$ at its control input.

Figure 6B:
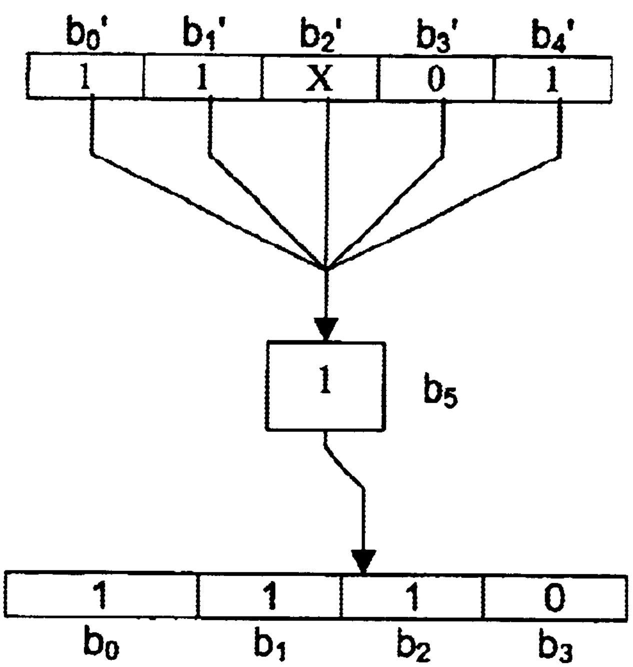
Figure 6B:
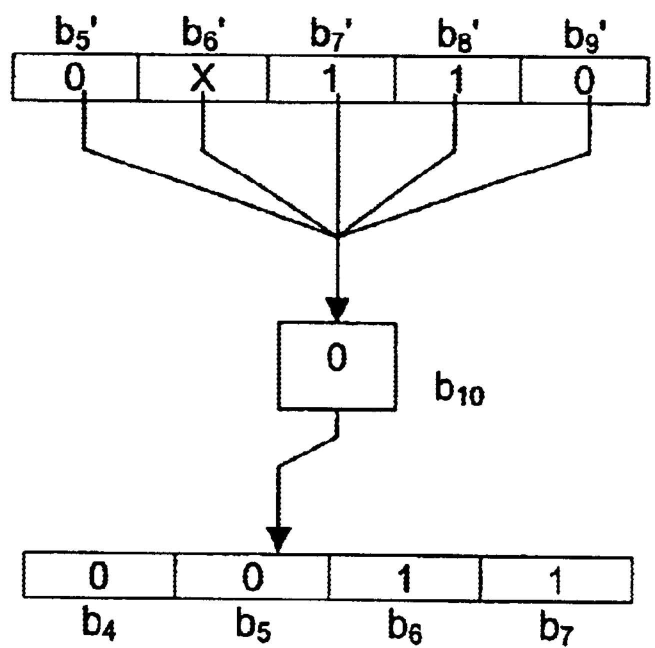

The operation of the correction circuit DCC1 is straightforward. Each multiplexer MUX0 to MUX7 selects, at its output, the bit $b_i$ received at input if the signal $Sx_i$ at the control input is at a logic 0 or selects the parity bit $b_9$ at its output if the signal $Sx_i$ is equal to a logic 1 (erroneous bit). The circuit DCC1 thus carries out the method described above in replacing an erroneous bit by the parity bit $b_9$ computed from all the bits of the binary word b0–b8, including the parity bit $b_8$. Since an erroneous bit is by convention equal to a logic 0, its injection into the input of the circuit PCC has no effect on the parity computation, which takes account only of the number of logic 1s present in the string of bits. Naturally, the circuit DCC1 can correct only one bit at a time. To correct two bits or more, it is necessary to add one or more additional parity bits and subdivide the binary word into two or more elementary bit strings each comprising a parity bit as described above, as illustrated in FIG. 6B for example.

A method of reading an EEPROM type memory cell has thus been described in which the programmed state or erased state results in negative or positive threshold voltages Vt. It can be clearly seen by those skilled in the art that the above teachings are applicable to FLASH type memory cells which are floating-gate transistors whose threshold voltage Vt, although it is always positive, has different values between the erased state and the programmed state. These values are respectively above and below the domain of the virgin cells.

As is well known to those skilled in the art, the domain of the threshold voltages of the virgin cells is a characteristic that is controlled by varying the doping of the transistors and/or the thickness of the gate oxide. As above, a forbidden region is thus defined. This forbidden region is defined by two reference voltages $Vt_1$, $Vt_2$ that are midway between the region of the threshold voltages of the programmed transistors and the region of the threshold voltages of the erased transistors. Preferably, this forbidden region must include the domain of the virgin cells or at least be included in the domain of the virgin cells so that the erroneous state according to the invention is stable.

Even more generally speaking, the above teaching is applicable to any non-volatile memory whose memory cells have a remanent electrical characteristic that is capable of slowly slipping towards an erroneous value as a result of a manufacturing defect. The present invention can thus be applied inter alia to ferro-electric memories.

Furthermore, it can clearly be seen by those skilled in the art that the error correction method according to the invention can be combined with other type error detection methods. Similarly, the reading method according to the invention incorporating an error detection can be combined with other error correction methods.

That which is claimed is:

1. A method for reading a string of bits and correcting an erroneous bit therein, the method comprising:

reading the string of bits, the reading comprising delivering a bit having a first logic value when an electrical characteristic of a memory cell is above a first threshold, delivering a bit having a second logic value when the electrical characteristic of the memory cell is below a second threshold lower than the first threshold, and delivering an erroneous bit signal when the electrical characteristic of the memory cell is between the first and second thresholds; and correcting the erroneous bit in the string of bits, the correcting comprising computing a first parity bit from the string of bits at a point in time when the string of bits are all valid, computing a second parity bit based upon the computed first parity bit and the string of bits with the erroneous bit being excluded from the string of bits, and replacing the erroneous bit with the computed second parity bit.

2. A method according to claim 1, wherein a logic value of the erroneous bit is included in the string of bits when the second parity bit is computed but does not affect computation of the second parity bit.

3. A method according to claim 1, wherein replacing the erroneous bit is performed using at least one multiplexer circuit.

4. A method according to claim 1, wherein the string of bits defines a binary word; and the method further comprises splitting the string of bits into at least two strings of bits each comprising a first parity bit being computed therefor.

5. A method according to claim 1, wherein delivering the bit having the second logic value also occurs when the electrical characteristic of the memory cell is below the first threshold.

6. A method according to claim 1, wherein the reading comprises reading the string of bits from a plurality of non-volatile memory cells.

7. A method according to claim 6, wherein the reading comprises:

comparing a current flowing through a memory cell using a first comparator with a first reference current for delivering the bit having the first logic value being used as a data bit read in the memory cell;

comparing the current flowing through the memory cell using a second comparator with a second reference current for delivering the bit having the second logic value as the data bit read in the memory cell; and combining the first and second logic values using an XOR function for delivering the erroneous bit signal.

8. A method for correcting an erroneous bit in a string of bits, the method comprising:

reading the string of bits from a plurality of non-volatile memory cells, the reading comprising delivering a bit having a first logic value when an electrical characteristic of a memory cell is above a first threshold, delivering a bit having a second logic value when the electrical characteristic of the memory cell is below a second threshold lower than the first threshold, and delivering an erroneous bit signal when the electrical characteristic of the memory cell is between the first and second thresholds;

computing a first parity bit from the string of bits at a point in time when the string of bits are all valid;

computing a second parity bit based upon the computed first parity bit and the string of bits with the erroneous bit being excluded from the string of bits, and replacing the erroneous bit with the computed second parity bit.

9. A method according to claim 8, wherein a logic value of the erroneous bit is included in the string of bits when the second parity bit is computed but does not affect computation of the second parity bit.

10. A method according to claim 8, wherein replacing the erroneous bit is performed using at least one multiplexer circuit.

11. A method according to claim 8, wherein the string of bits defines a binary word; and the method further comprises splitting the string of bits into at least two strings of bits each comprising a first parity bit being computed therefor.

12. A method according to claim 8, wherein delivering a bit having the second logic value also occurs when the electrical characteristic of the memory cell is below the first threshold.

13. A method for correcting an erroneous bit in a string of bits, the method comprising:

reading the string of bits from a plurality of non-volatile memory cells, the reading comprising comparing a current flowing through a memory cell using a first comparator with a first reference current for delivering a first bit value used as a data bit read in the memory cell, comparing the current flowing through the memory cell using a second comparator with a second reference current for delivering a second bit value as the data bit read in the memory cell, and combining the first and second bit values using an XOR function for delivering an erroneous bit signal;

computing a first parity bit from the string of bits at a point in time when the string of bits are all valid;

computing a second parity bit based upon the computed first parity bit and the string of bits with the erroneous bit being excluded from the string of bits, and replacing the erroneous bit with the computed second parity bit.

14. A method according to claim 13, wherein a logic value of the erroneous bit is included in the string of bits when the second parity bit is computed but does not affect computation of the second parity bit.

15. A method according to claim 13, wherein replacing the erroneous bit is performed using at least one multiplexer circuit.

16. A method according to claim 13, wherein the string of bits defines a binary word; and the method further comprises splitting the string of bits into at least two strings of bits each comprising a first parity bit being computed therefor.

17. A non-volatile memory comprising:

a plurality of memory cells;

a read circuit for reading a string of bits from said plurality of memory cells and delivering a bit having a first logic value when an electrical characteristic of a memory cell is above a first threshold, delivering a bit having a second logic value when the electrical characteristic of the memory cell is below a second threshold lower than the first threshold, and delivering an erroneous bit signal when the electrical characteristic of the memory cell is between the first and second thresholds; and a correction circuit for correcting an erroneous bit in the string of bits by computing a first parity bit from the string of bits at a point in time when the string of bits are all valid, computing a second parity bit based upon the computed first parity bit and the string of bits with the erroneous bit being excluded from the string of bits, and replacing the erroneous bit with the computed second parity bit.

18. A memory according to claim 17, wherein said read circuit assigns a logic value to the erroneous bit without affecting computation of the second parity bit.

19. A memory according to claim 17, wherein said correction circuit receives the string of bits including a logic value of the erroneous bit.

20. A memory according to claim 17, wherein said correction circuit comprises at least one multiplexer for replacing the erroneous bit by the second parity bit.

21. A memory according to claim 17, wherein said read circuit also provides the bit having the second logic value when the electrical characteristic of the memory cell is below the first threshold.

22. A memory according to claim 17, wherein the first and second thresholds define a region corresponding to a memory cell that has never been programmed so that a condition of the erroneous bit remains stable.

23. A memory according to claim 17, wherein each of said plurality of memory cells comprises a floating-gate transistor; and wherein said read circuit compares a current flowing through a memory cell with two reference currents, and sends an erroneous bit signal when the current flowing through said floating-gate transistor in the memory cell is between the two reference currents.

24. A memory according to claim 23, wherein said reading circuit comprises:

a first comparator for comparing the current flowing through the memory cell with a first reference current for delivering the bit having the first logic value being used as a data bit read in the memory cell;

a second comparator for comparing the current flowing through the memory cell with a second reference current for delivering the bit having the second logic value as the data bit read in the memory cell; and an XOR logic circuit for combining the first and second logic values for delivering the erroneous bit signal.

* * * * *